United States Patent
In et al.

(10) Patent No.: US 10,177,281 B2
(45) Date of Patent: Jan. 8, 2019

(54) LIGHT-EMITTING DIODE

(71) Applicant: SEOUL VIOSYS CO., LTD., Ansan-si (KR)

(72) Inventors: Chi Hyun In, Ansan-si (KR); Sang Min Kim, Ansan-si (KR); Dae Seok Park, Ansan-si (KR); Eun Ji Park, Ansan-si (KR); Hong Suk Cho, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/722,826

(22) Filed: Oct. 2, 2017

(65) Prior Publication Data
US 2018/0182925 A1    Jun. 28, 2018

Related U.S. Application Data

(62) Division of application No. 15/329,993, filed as application No. PCT/KR2015/008010 on Jul. 30, 2015, now Pat. No. 9,812,616.

(30) Foreign Application Priority Data

Jul. 31, 2014   (KR) .................. 10-2014-0098641
Sep. 30, 2014   (KR) .................. 10-2014-0131604

(51) Int. Cl.
*H01L 33/46*        (2010.01)
*H01L 33/62*        (2010.01)
(Continued)

(52) U.S. Cl.
CPC .............. *H01L 33/46* (2013.01); *H01L 33/14* (2013.01); *H01L 33/38* (2013.01); *H01L 33/405* (2013.01);
(Continued)

(58) Field of Classification Search
None
See application file for complete search history.

(56) References Cited

U.S. PATENT DOCUMENTS

2014/0054633 A1    2/2014  Kim
2018/0182925 A1*   6/2018  In ........................... H01L 33/62

FOREIGN PATENT DOCUMENTS

CN        101350381 A     1/2009
CN        102742010 A    10/2012
(Continued)

OTHER PUBLICATIONS

International Search Report, PCT/KR2015/008010, dated Nov. 11, 2015, 2 pages.

*Primary Examiner* — Jack Chen
(74) *Attorney, Agent, or Firm* — Perkins Coie LLP

(57) ABSTRACT

A light emitting diode includes a substrate, a lower semiconductor layer disposed on the substrate, a light emitting unit comprising a first upper semiconductor layer disposed in one region of the lower semiconductor layer and an active layer interposed between the lower semiconductor layer and the first upper semiconductor layer, a second current spreading portion comprising a third upper semiconductor layer disposed in another region of the lower semiconductor layer and an active layer interposed between the lower semiconductor layer and the third upper semiconductor layer, a first electrode disposed on the light emitting cell and electrically connected to the first upper semiconductor layer, and a second electrode separated from the light emitting cell and electrically connected to the lower semiconductor layer.

20 Claims, 8 Drawing Sheets

(51) Int. Cl.
    *H01L 33/14*    (2010.01)
    *H01L 33/40*    (2010.01)
    *H01L 33/38*    (2010.01)
    *H01L 33/44*    (2010.01)
(52) U.S. Cl.
    CPC .............. *H01L 33/44* (2013.01); *H01L 33/62* (2013.01); *H01L 2224/13* (2013.01); *H01L 2224/14* (2013.01); *H01L 2224/16225* (2013.01); *H01L 2224/48091* (2013.01); *H01L 2224/48247* (2013.01); *H01L 2224/48257* (2013.01)

(56) References Cited

FOREIGN PATENT DOCUMENTS

| | | |
|---|---|---|
| CN | 103053036 A | 4/2013 |
| JP | 2011204838 A | 10/2011 |
| KR | 1020120135903 A | 12/2012 |
| KR | 101316119 B1 | 10/2013 |
| KR | 1020140049877 A | 4/2014 |

* cited by examiner

FIG. 8A
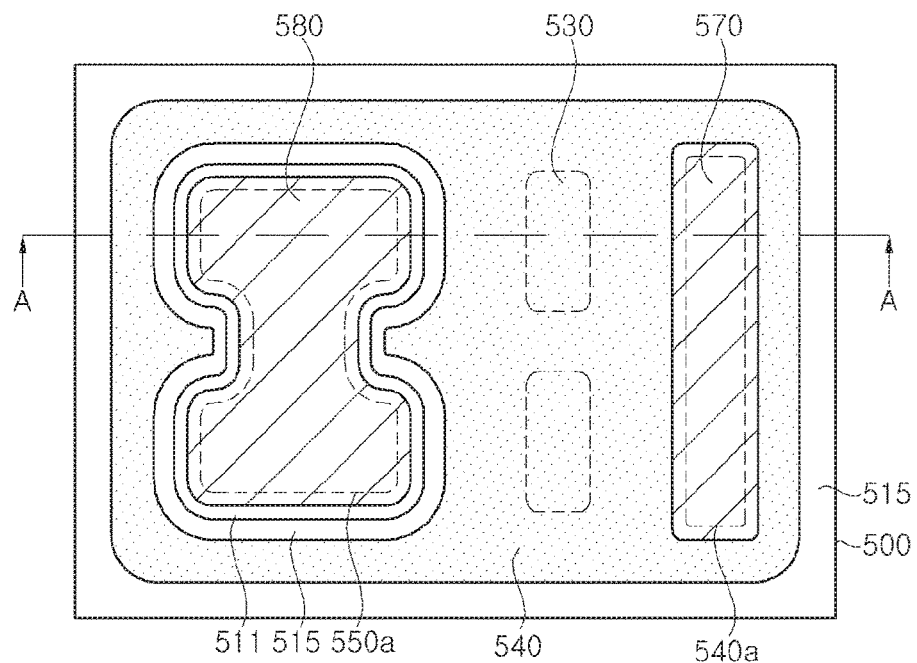
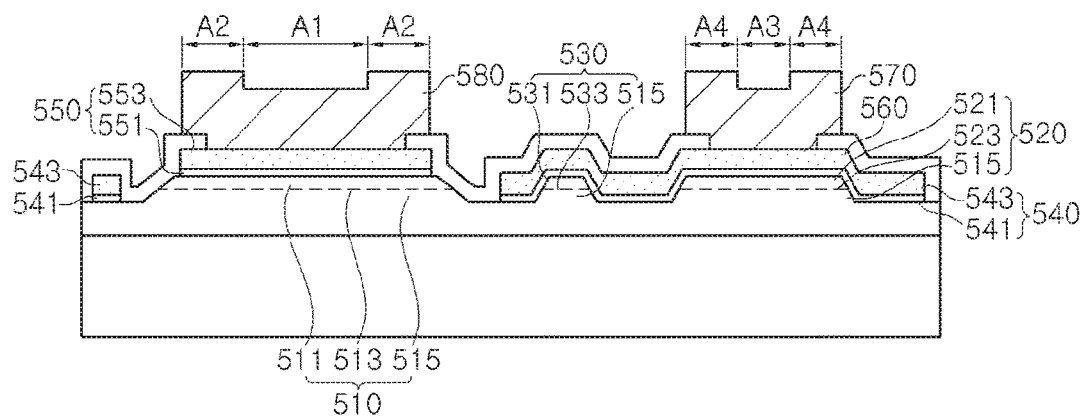
FIG. 8B

LIGHT-EMITTING DIODE

PRIORITY CLAIMS AND CROSS-REFERENCE TO RELATED APPLICATIONS

This application is a divisional application of and claims the benefits and priority of U.S. patent application Ser. No. 15/329,993, filed on Jan. 27, 2017, which claims the priority to International Application No. PCT/KR/2015008010, filed on Jul. 30, 2015, and further claims foreign priority to Korean Application No. KR10-2014-0098641, filed Jul. 31, 2014, and KR 10-2014-0131604, filed Sep. 30, 2014, the contents which are incorporated by reference herein in its entirety.

TECHNICAL FIELD

Exemplary embodiments of the present disclosure relate to a light emitting diode. More particularly, exemplary embodiments of the present disclosure relate to a light emitting diode having improved reliability.

BACKGROUND

A light emitting diode refers to an inorganic semiconductor device emitting light through recombination of electrons and holes, and has been used in various fields including displays, car lamps, general lighting, and the like. The light emitting diode may include electrodes, bumps electrically connected to the electrodes, and an insulation layer around the bumps. A space between the bumps and the insulation layer can cause deterioration in reliability of the light emitting diode. Moreover, lateral arrangement of the electrodes can cause current crowding in a specific region upon high current driving.

SUMMARY

Exemplary embodiments of the present disclosure provide a light emitting diode having improved reliability and structural stability.

Exemplary embodiments of the present disclosure provide a light emitting diode which prevents deterioration in luminous characteristics under high temperature and/or high humidity conditions.

Exemplary embodiments of the present disclosure provide a light emitting diode which includes a substrate and bumps coupled to each other with high coupling strength.

Exemplary embodiments of the present disclosure provide a light emitting diode having improved luminous efficacy and exhibiting less deviation in luminous intensity in an active layer.

Exemplary embodiments of the present disclosure provide a light emitting diode which includes a structure capable of improving current spreading efficiency and has improved light extraction efficiency by light reflection through the structure.

In accordance with one exemplary embodiment of the present disclosure, a light emitting diode includes: a substrate; a light emitting cell disposed on the substrate and including a lower semiconductor layer, an upper semiconductor layer disposed in one region of the lower semiconductor layer, and an active layer interposed between the lower semiconductor layer and the upper semiconductor layer; a first electrode disposed on the upper semiconductor layer; a second electrode disposed on the lower semiconductor layer; a first insulation layer including a first open region partially exposing the first electrode; a second insulation layer disposed on the first insulation layer; and a first bump forming ohmic contact with the first electrode through the first open region, wherein the first bump includes a first concave portion and a first convex portion formed on an upper surface thereof; wherein the first bump includes has a first region disposed on the upper surface thereof and including a bottom surface of the first concave portion and a second region disposed on the upper surface thereof and including an upper surface of the first convex portion; and wherein at least part of the first region is disposed on the first open region and at least part of the second region is disposed on the second insulation layer.

An area of the bottom surface of the first concave portion may be proportional to an area of the first electrode exposed through the first open region.

A depth of the first concave portion may be proportional to a thickness of the first insulation layer and the second insulation layer disposed on the first electrode.

In some exemplary embodiments, the sum of areas of the upper surface of the first convex portion and the bottom surface of the first concave portion may be larger than an area of the first electrode exposed at least through the first open region.

The first insulation layer and the second insulation layer may be partially interposed between the first electrode and the first bump.

Side surfaces of the first insulation layer and the second insulation layer surrounding the first open region may adjoin at least part of a lower side surface of the first bump.

The first convex portion may surround the first concave portion.

The first insulation layer may include a second open region exposing a portion of the second electrode, and further include a second bump forming ohmic contact with the second electrode through the second open region, wherein the second bump may include a second concave portion and a second convex portion formed on an upper surface thereof, wherein the second bump may include a third region formed on the upper surface thereof and including a bottom surface of the second concave portion and a fourth region formed on the upper surface thereof and including an upper surface of the second convex portion, and wherein at least part of the third region is disposed on the second open region and at least part of the fourth region is disposed on the second insulation layer.

An area of the bottom surface of the second concave portion may be proportional to an area of the second electrode exposed through the second open region.

A depth of the second concave portion may be proportional to a thickness of the first insulation layer and the second insulation layer disposed on the second electrode.

The sum of areas of the upper surface of the second convex portion and the bottom surface of the second concave portion may be larger than an area of the second electrode exposed through the second open region.

In some exemplary embodiments, the first insulation layer and the second insulation layer may be partially interposed between the second electrode and the second bump.

In addition, side surfaces of the first insulation layer and the second insulation layer surrounding the second open region may adjoin at least part of a lower side surface of the second bump.

The second convex portion may surround the second concave portion.

The second insulation layer may include a silicon nitride layer.

The light emitting cell may emit light in the UV wavelength range.

The substrate may include one surface on which the light emitting cell is disposed, and the other surface opposite the one surface and including a convex-concave portion.

The substrate may be a transparent sapphire substrate.

The first insulation layer may include a distributed Bragg reflector.

In accordance with another exemplary embodiment of the present disclosure, a light emitting diode includes: a substrate; a lower semiconductor layer disposed on the substrate; a light emitting unit including a first upper semiconductor layer disposed in one region of the lower semiconductor layer and an active layer interposed between the lower semiconductor layer and the first upper semiconductor layer; a second current spreading portion including a third upper semiconductor layer disposed in another region of the lower semiconductor layer and an active layer interposed between the lower semiconductor layer and the third upper semiconductor layer; a first electrode disposed on the light emitting cell and electrically connected to the first upper semiconductor layer; and a second electrode separated from the light emitting cell and electrically connected to the lower semiconductor layer, wherein the second electrode extends to cover at least part of the second current spreading portion while surrounding at least part of the light emitting cell, and wherein contact resistance between the second electrode and the third upper semiconductor layer may be higher than contact resistance between the second electrode and the lower semiconductor layer.

The light emitting diode may further include a first current spreading portion disposed m a third region of the lower semiconductor layer opposite the one region of the lower semiconductor layer with reference to the other region of the lower semiconductor layer, wherein the first current spreading portion includes a second upper semiconductor layer disposed in the third region of the lower semiconductor layer and an active layer interposed between the lower semiconductor layer and the second upper semiconductor layer.

Contact resistance between the second electrode and the second upper semiconductor layer may be higher than contact resistance between the second electrode and the lower semiconductor layer.

The second electrode may be disposed on the first current spreading portion.

The second current spreading portion may be disposed closer to the first current spreading portion than the light emitting cell.

The first current spreading portion may have the same height as the light emitting cell.

The sum of areas of upper surfaces of the first current spreading portion and the second current spreading portion may be 10% to 40% of an area of the second electrode.

The second current spreading portion may include a plurality of spreading structures separated at regular intervals from each other.

The light emitting diode may further include an insulation layer disposed on the first electrode and the second electrode, and including a first open region exposing the first electrode and a second open region exposing the second electrode.

The insulation layer may include at least one of a silicon nitride layer and a silicon oxide layer.

The insulation layer may include a distributed Bragg reflector.

The light emitting diode may further include a first bump electrically connected to the first electrode through the first open region; and a second bump electrically connected to the second electrode through the second open region.

The first bump may include a first concave portion and a first convex portion formed on an upper surface thereof, and may include a first region formed on the upper surface thereof and including a bottom surface of the first concave portion and a second region formed on the upper surface thereof and including an upper surface of the first convex portion, wherein at last part of the first region is disposed on the first open region and at least part of the second region is disposed on the insulation layer.

An area of the bottom surface of the first concave portion may be proportional to an area of the first electrode exposed through the first open region.

A depth of the first concave portion may be proportional to a thickness of the insulation layer disposed on the first electrode.

The sum of areas of the upper surface of the first convex portion and the bottom surface of the first concave portion may be larger than an area of the first electrode exposed through the first open region.

The first convex portion may surround the first concave portion.

The insulation layer may be partially interposed between the first electrode and the first bump and between the second electrode and the second bump.

A side surface of the insulation layer surrounding the first open region may adjoin at least part of a side surface of the first bump.

The second electrode may include a reflective layer reflecting light emitted from the active layer of the light emitting cell.

According to exemplary embodiments of the present disclosure, the light emitting diode has improved reliability not only under room temperature conditions but also under high temperature and/or high humidity conditions, thereby preventing deterioration in luminous characteristics. In addition, the light emitting diode has high coupling strength between a substrate and bumps to prevent separation of the light emitting diode from the substrate even upon repeated application of load to coupled regions between the substrate and the bumps. Further, the light emitting diode according to the exemplary embodiments includes a current spreading portion acting as a current spreading structure. Accordingly, the current spreading portion guides current flow mainly through a metal electrode while spreading electric current, thereby further improving current spreading performance of the light emitting diode. Therefore, the light emitting diode can have improved luminous efficacy while reducing deviation in luminous intensity. Furthermore, the current spreading portion can be formed without a separate additional process, thereby reducing manufacturing costs and time.

BRIEF DESCRIPTION OF DRAWINGS

FIGS. 8A and 8B show a plan view and a cross-sectional view of a light emitting diode according to one exemplary embodiment of the present disclosure.

Figure 1:
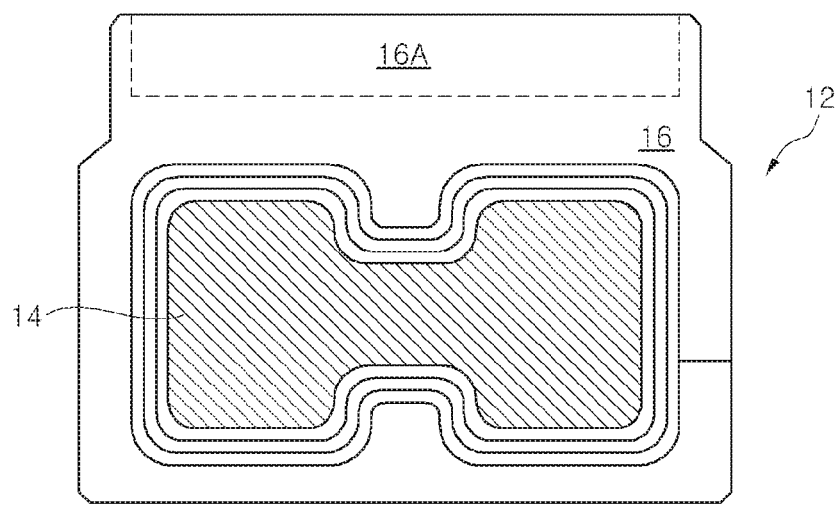
FIG. 1 is a sectional view of a light emitting diode.

Hereinafter, exemplary embodiments of the present disclosure will be described in detail with reference to the accompanying drawings. The following embodiments are provided by way of example. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

FIG. 1 is a sectional view of a light emitting diode.

Referring to FIG. 1, the light emitting diode includes an H-shaped contact layer 14. The light emitting diode may further include a bump for current application formed on the contact layer 14 and an insulation layer formed on an upper layer 16 excluding a bump region. However, a space is formed between the bump and the insulation layer. Although this space is present for a process of manufacturing the light emitting diode, the space can cause deterioration in reliability of the light emitting diode. A light emitting diode, particularly, a UV light emitting diode, is vulnerable to high temperature and/or high humidity, thereby causing a problem in terms of reliability. The space of the light emitting diode can be used as a path through which external moisture and/or air flows into the light emitting diode.

On the other hand, the light emitting diode includes n-type and p-type bumps, which are mounted on a sub-mount substrate. However, when a load is repeatedly applied to coupled regions between the n-type and p-type bumps and the sub-mount substrate, coupling strength between the bumps and the sub-mount substrate is relieved, thereby causing separation between the light emitting diode and the substrate. Therefore, there is a need for development of a light emitting diode having improved reliability and structural stability by overcoming the aforementioned problems.

On the other hand, the light emitting diode can be classified into a lateral type light emitting diode, a vertical type light emitting diode, and a flip-chip type light emitting diode depending upon locations of electrodes or a connection structure between the electrodes and external leads.

A lateral type light emitting diode can be easily manufactured and thus is the most widely used in the art. Such a lateral type light emitting diode includes a growth substrate at a lower side thereof. Although a sapphire substrate is the most widely used in the art as the growth substrate of the light emitting diode, the sapphire substrate has low thermal conductivity and thus suffers from difficulty in heat dissipation from the light emitting diode. As a result, the bonding temperature of the light emitting diode increases, thereby causing deterioration in internal quantum efficiency.

In order to solve the problems of the lateral type light emitting diode, a vertical type light emitting diode or a flip-chip type light emitting diode is being developed in the art.

Figure 2A:
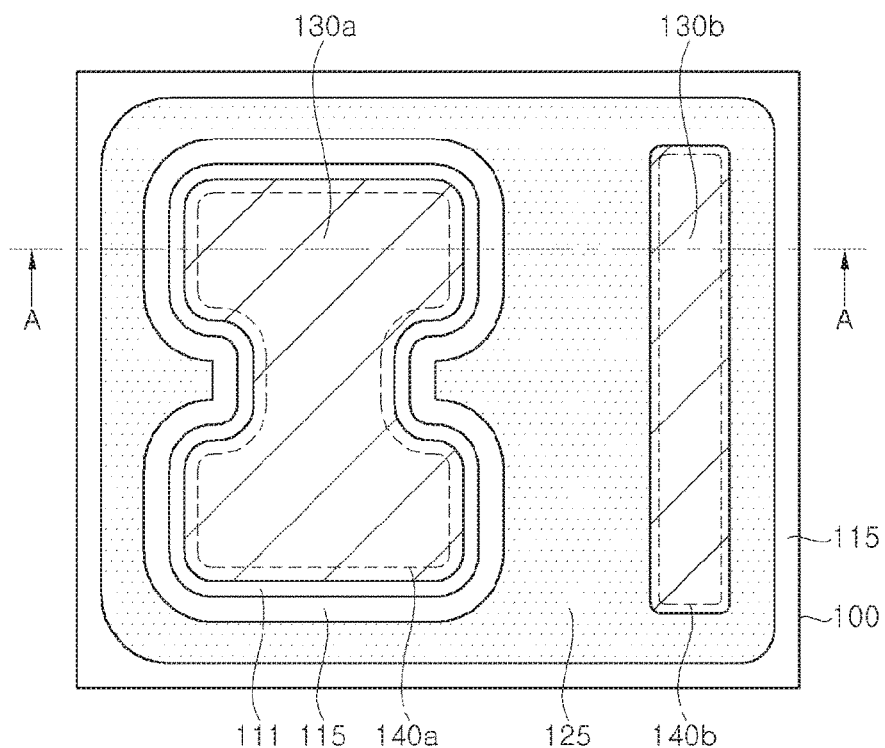
FIGS. 2A and 2B show a plan view and a cross-sectional view of a light emitting diode according to one exemplary embodiment of the present disclosure.
Figure 2B:
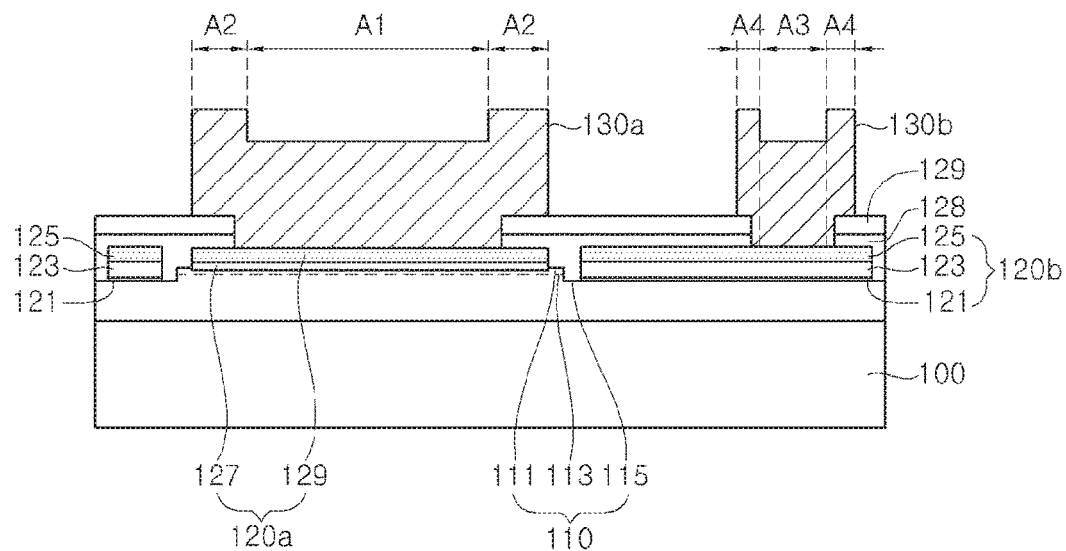

FIGS. 2A and 2B show a plan view and a cross-sectional view of a light emitting diode according to one exemplary embodiment of the present disclosure.

FIG. 2A is a plan view of the light emitting diode and FIG. 2B is a cross-sectional view of the light emitting diode taken along line A-A of FIG. 2A.

Referring to FIGS. 2A and 2B, the light emitting diode includes a growth substrate 100, a lower semiconductor layer 115, an active layer 113, and an upper semiconductor layer 111. A contact layer 121, a pad layer 123 and an electrode layer 125 are disposed on the lower semiconductor layer 115. A second electrode 120b may include the contact layer 121, the pad layer 123 and the electrode layer 125.

A second bump 130b is disposed on the second electrode 120b. A reflective layer 127 and a barrier layer 129 are disposed on the upper semiconductor layer 111 and may constitute a first electrode 120a. A first bump 130a is disposed on the first electrode 120a. An overall upper surface of the light emitting diode may be covered by a first insulation layer 128 and a second insulation layer 129 excluding regions in which the first bump 130a and the second bump 130b are disposed. On the other hand, a light emitting cell 110 may be composed of the lower semiconductor layer 115, the active layer 113 and the upper semiconductor layer 111.

The growth substrate 100 is a substrate having a hexagonal crystal structure and may be a growth substrate which allows growth of a gallium nitride epitaxial layer thereon, for example, a sapphire substrate, a silicon carbide substrate, or a gallium nitride substrate. Particularly, in order to form a deep-UV light emitting diode, the growth substrate 100 may be a sapphire substrate. The growth substrate 100 includes one surface, the other surface opposite the one surface, and a side surface connecting the one surface to the other surface. The one surface of the growth substrate is a surface on which semiconductor layers are grown, and the other surface thereof is a surface through which light generated from the active layer 113 is discharged. The side surface of the growth substrate 100 may be perpendicular to the one surface and the other surface, or may be an inclined surface. Before formation of the lower semiconductor layer 115 on one surface of the growth substrate 100, a buffer layer (not shown) including AlN or GaN may be formed thereon in order to reduce lattice mismatch with the sapphire substrate.

Further, the growth substrate 100 may have a substantially quadrangular shape, without being limited thereto. On the other hand, in this exemplary embodiment, the growth substrate 100 may have a thickness of greater than 100 μm, specifically 150 μm to 400 μm. A higher thickness of the growth substrate 100 provides better light extraction efficiency. On the other hand, the side surface of the growth substrate 100 may include a breaking plane.

The lower semiconductor layer 115 is disposed on one surface of the growth substrate 100. The lower semiconductor layer 115 may cover the entirety of the one surface of the growth substrate 100, without being limited thereto. Alternatively, the lower semiconductor layer 115 may be disposed restrictively on an upper region of the growth substrate 100 such that the one surface of the growth substrate is exposed along an edge thereof.

The upper semiconductor layer 111 is disposed on one region of the lower semiconductor layer 115 and the active layer 113 is interposed between the lower semiconductor layer 115 and the upper semiconductor layer 111. The upper semiconductor layer 111 has an H shape or a dumbbell shape with a narrow waist, thereby providing good light output under high current density conditions.

The lower semiconductor layer 115 and the upper semiconductor layer 111 may include Group 111-V based compound semiconductors, and, for example, may include a nitride-based semiconductor such as (Al, Ga, In)N. The lower semiconductor layer 115 may include an n-type semiconductor layer doped with n-type dopants (for example, Si) and the upper semiconductor layer 111 may include a p-type semiconductor layer doped with p-type dopants (for example, Mg), or vice versa. In addition, the lower semiconductor layer 115 and/or the upper semiconductor layer 111 may be composed of a single layer or multiple layers. For example, the lower semiconductor layer 115 and/or the upper semiconductor layer 111 may include a clad layer and a contact layer, and may include a super-lattice layer.

The active layer 113 may include a multi-quantum well (MQW) structure and elements and a composition of the multi-quantum well (MQW) structure may be adjusted to emit light having a desired peak wavelength. For example, well layers of the active layer 113 may be ternary semiconductor layers such as $In_xGa(1-x)N (O=x=1)$ or quaternary semiconductor layers such as $Al_xIn_yGa(1-x-y)N(O=x=1, O=y=1, O=x+y=1)$, in which x or y may be adjusted to emit light having a desired peak wavelength, without being limited thereto.

The above semiconductor layers 111, 113, 115 may be formed through various deposition and growth processes including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and the like.

Herein, descriptions of details of the semiconductor layers 111, 113, 115 including III-V based compound semiconductors well known to those skilled in the art will be omitted.

On the other hand, the second electrode 120b including the contact layer 121, the pad layer 123 and the electrode layer 125 may surround the upper semiconductor layer 111. Although the second electrode 120b is illustrated as surrounding the entire periphery of the upper semiconductor layer 111 in FIGS. 2A and 2B, it should be understood that other implementations are also possible. The second electrode 120b may extend from the second bump 130b to both sides of the upper semiconductor layer 111 so as to surround about 50% or more of the upper semiconductor layer 111. The contact layer 121 may include at least one of Cr, Ti, Al and Au, or may have a multilayer structure of Cr/Ti/Al/Ti/Au layers. The pad layer 123 may include Ti or Au, or may have a multilayer structure of Ti/Au layers. The electrode layer 125 may include Ti or Au, or may have a multilayer structure of Ti/Au layers.

The second electrode 120b may be evenly separated from the upper semiconductor layer 111. With this structure, the light emitting diode can prevent current crowding. Furthermore, a convex-concave portion (not shown) may be formed on the surface of the lower semiconductor layer 115 between the second electrode 120b and the upper semiconductor layer 111. The convex-concave portion can prevent current flow along the surface of the upper semiconductor layer 111, thereby improving current spreading efficiency.

On the other hand, the reflective layer 127 and the barrier layer 129 may form the first electrode 120a, which is disposed on the upper semiconductor layer 111 and is electrically connected to the upper semiconductor layer 111. The reflective layer 127 may include at least one of Ni, Au and Al, or may have a multilayer structure of Ni/Au. The barrier layer 129 may include Ti or Au, or may have a multilayer structure of Ti/Au. The first electrode 120a has high reflectance and can form ohmic contact with the upper semiconductor layer 111.

The second bump 130b is disposed on the second electrode 120b. The second bump 130b is separated from the upper semiconductor layer 111. The first bump 130a is disposed on the first electrode 120a including the reflective layer 127 and the barrier layer 129.

The first bump 130a may include a first region A1 and a second region A2. The first bump 130a may include a first concave portion and a first convex portion formed on an upper surface thereof. The first region A1 may include the first concave portion and thus an upper surface of the first region A1 may correspond to a bottom surface of the first concave portion. The second region A2 may include the first convex portion and thus an upper surface of the second region A2 may correspond to an upper surface of the first convex portion.

The second bump 130b may include a third region A3 and a fourth region A4. The second bump 130b may include a second concave portion and a second convex portion formed on an upper surface thereof. The third region A3 may include the second concave portion and thus an upper surface of the third region A3 may correspond to a bottom surface of the second concave portion. The fourth region A4 may include the second convex portion and thus an upper surface of the fourth region A4 may correspond to an upper surface of the second convex portion.

The second bump 130b and the first bump 130a may be formed of the same metallic material. In addition, the first and second bumps 130a, 130b may have a multilayer structure, and may include, for example, an adhesive layer, an anti-diffusion layer and a bonding layer. For example, the adhesive layer may include Ti, Cr or Ni, the anti-diffusion layer may include Cr, Ni, Ti, W, TiW, Mo, Pt, or a combination thereof, and the bonding layer may include Au or AuSn.

On the other hand, the first insulation layer 128 covers and protects the lower semiconductor layer 115, the active layer 113, the upper semiconductor layer 111, the second electrode 120b, the reflective layer 127 and the barrier layer 129 excluding regions in which the first bump 130a and the second bump 130b are disposed. The first insulation layer 128 may be composed of a single layer of silicon oxide or silicon nitride. Furthermore, the first insulation layer 128 may be composed of a distributed Bragg reflector in which oxide layers having different indices of refraction are stacked one above another. Accordingly, the first insulation layer 128 can reflect light in a region between the first electrode 121a and the upper semiconductor layer 111, thereby further improving light extraction efficiency of the light emitting diode. In addition, the second insulation layer 129 may be disposed on the first insulation layer 128. The second insulation layer 129 may be composed of a single layer of silicon oxide or silicon nitride. Particularly, in this exemplary embodiment, the second insulation layer 129 may be a silicon nitride layer. Since the silicon nitride layer exhibits better moisture-proof characteristics than the silicon oxide layer, the second insulation layer 129 formed of silicon nitride can improve moisture-proof characteristics of the light emitting diode.

Each of the first insulation layer 128 and the second insulation layer 129 may have a thickness of 2,000 A to 7,000 A. If each of the first insulation layer 128 and the second insulation layer 129 has a thickness of less than 2,000 A, it is difficult to improve moisture-proof characteristics, and if each of the first insulation layer 128 and the second insulation layer 129 has a thickness of greater than 7,000 A, the entire thickness of the insulation layers 127, 129 becomes too thick. Furthermore, the first insulation layer 128 and the second insulation layer 129 may have a total thickness of 1 μm or less, without being limited thereto.

In this exemplary embodiment, the first and second bumps 130a, 130b may be formed to cover part of the first and second insulation layers 128, 129. Accordingly, at least part of the second region A2 of the first bump 130a may be disposed on the second insulation layer 129. Furthermore, at least part of the fourth region A4 of the second bump 130b may be disposed on the second insulation layer 129. That is, the first and second insulation layers 128, 129 may be partially interposed between the first bump 130a and the first electrode 120a or between the second bump 130b and the second electrode 120b.

Referring again to FIGS. 2A and 2B, first and second open regions 140a, 140b are open such that side surfaces of the first and second insulation layers 128, 129 surrounding the first and second open regions 140a, 140b can be exposed therethrough, and the exposed side surfaces of the first and second insulation layers 128, 129 may adjoin the first bump 130a and/or the second bump 130b.

Further, referring again to FIG. 2A, it can be seen that the area of the first open region 140a is smaller than the sum of the areas of the bottom surface of the first concave portion of the first bump 130a and the upper surface of the first convex portion thereof. In addition, it can be seen that the area of the second open region 140b is smaller than the sum of the areas of the bottom surface of the second concave portion of the second bump 130b and the upper surface of the second convex portion thereof. That is, in this exemplary embodiment, the first and second bumps 130a, 130b can completely cover the first open region 140a and the second open region 140b, respectively.

In addition, the length of the upper surface of the first bump 130a is 14 μm to 18 μm longer than that of the upper surface of the first electrode 120a exposed through the second open region 140b, and may overlap the length of the upper surface of the first electrode 120a exposed through the second open region 140b.'

The light emitting diode may further include a resin (not shown) surrounding the side surfaces of the first bump 130a and the second bump 130b. In the structure wherein the light emitting diode includes the resin, the first bump 130a and the second bump 130b may be embedded in the resin such that the upper surfaces of the first bump 130a and the second bump 130b can be exposed.

In this exemplary embodiment, there is no space between the first and second insulation layers 128, 129 and the first and second bumps 130a, 130b. Accordingly, the first and second electrodes 120a, 120b can be completely sealed. Thus, since it is possible to perfectly prevent moisture from penetrating the light emitting diode, the light emitting diode has improved reliability. Further, in this exemplary embodiment, a multilayer structure of the first and second insulation layers 128, 129 covers the overall upper surface of the light emitting diode, thereby more effectively blocking penetration of moisture.

In addition, the area of the bottom surface of the concave portion of each of the first and second bumps 130a, 130b may be proportional to the area of each of the first and second electrodes 120a, 120b exposed through the first and second open regions 140a, 140b, and a depth of the concave portion thereof may be proportional to a thickness of the first and second insulation layers 128, 129 disposed on the first electrode 120a or the second electrode 120b.

In this exemplary embodiment, the concave portions and the convex portions of the first and second bumps 130a, 130b can provide strong coupling strength to the light emitting diode upon mounting the light emitting diode on a printed circuit board or a sub-mount substrate.

Figure 3:
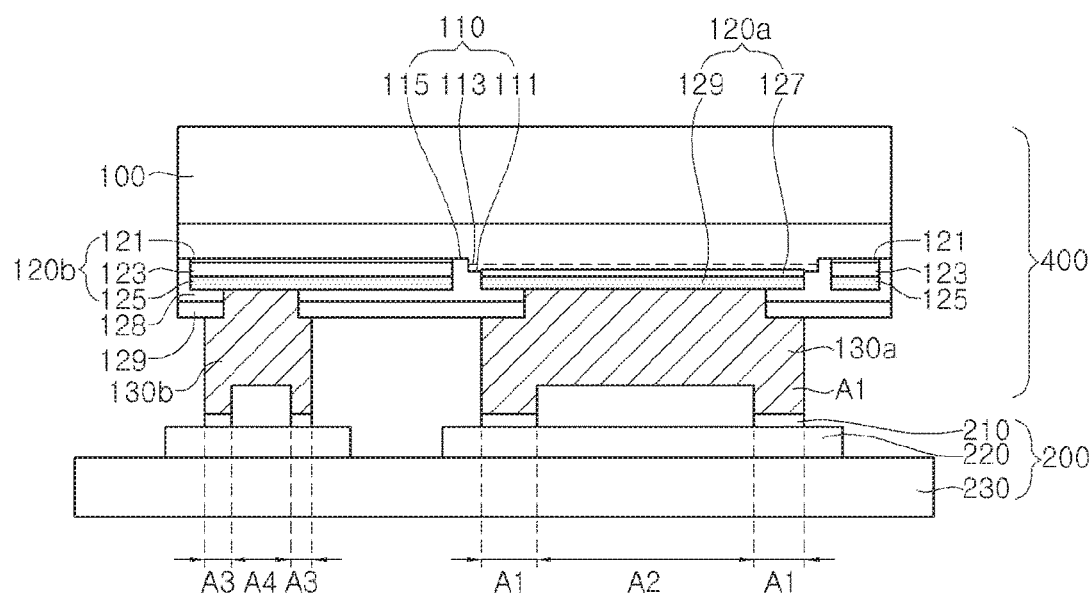
FIG. 3 is a side sectional view of a light emitting device according to one exemplary embodiment of the present disclosure.

FIG. 3 is a side sectional view of a light emitting device according to one exemplary embodiment of the present disclosure.

Referring to FIG. 3, a light emitting diode 400 is the light emitting diode according to the above exemplary embodiment and is mounted on a sub-mount substrate 200.

The sub-mount substrate 200 includes a substrate 230 and an electrode pattern 220 formed on the substrate 230. The substrate 230 may be any one selected from among BeO, SiC, Si, Ge, SiGe, AlN and ceramic substrates, which exhibit good thermal conductivity. However, it should be understood that other implementations are also possible and that the sub-mount substrate may include an insulation material having high thermal conductivity or a metallic material having high thermal conductivity and high electrical conductivity.

The electrode pattern 220 is formed corresponding to the shapes of the second bump 130b and the first bump 130a such that the second bump 130b and the first bump 130a are bonded to the electrode pattern 220. Here, bonding may be performed using heat, ultrasonic waves, or combination thereof. Alternatively, bonding may be performed using solder pastes.

The first and second bumps 130a, 130b may be bonded to the electrode pattern 220 in a bonding region 210 through various bonding methods as described above.

Figure 4A:
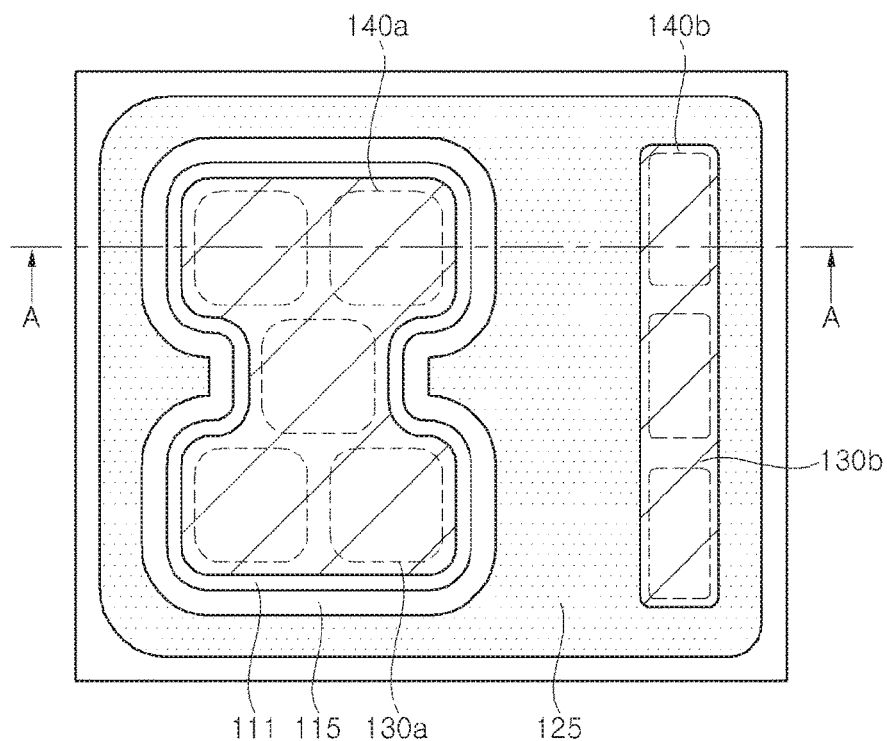
FIGS. 4A and 4B show a plan view and a cross-sectional view of a light emitting diode according to another exemplary embodiment of the present disclosure.
Figure 4B:
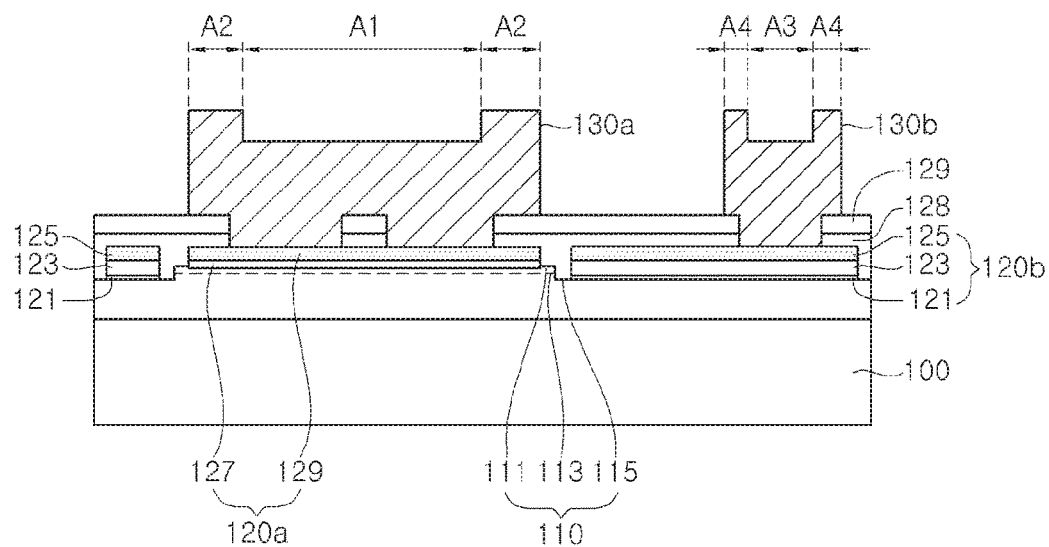

FIGS. 4A and 4B shows a plan view and a cross-sectional view of a light emitting diode according to another exemplary embodiment of the present disclosure. The light emitting diode according to the exemplary embodiment of FIGS. 4A and 4B is the same as the light emitting diode according to the exemplary embodiment shown in FIG. 2 excluding the shape of the first and second open regions. Thus, repeated descriptions will be omitted.

Referring to FIGS. 4A and 4B, each of the first open region 140a and the second open region 140b may include a plurality of open regions. Namely, as shown in FIGS. 4A and 4B, the first open region 140a includes a plurality of open regions through which the first electrode 120a is partially exposed, and the second open region 140b includes a plurality of open regions through which the second electrode 120b is partially exposed. In this exemplary embodiment, drive voltage of the light emitting diode can be reduced through the open regions 140a, 140b having such shapes.

In this exemplary embodiment, the first open region 140a includes five open regions and the second open region 140b includes three open regions. However, it should be understood that the number and arrangement of the open regions are not limited thereto.

Figure 5:
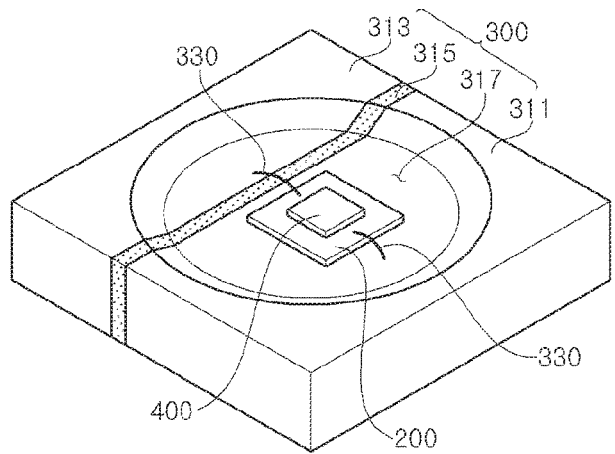
FIG. 5 is a perspective view of a light emitting diode package according to one exemplary embodiment of the present disclosure.

FIG. 5 is a perspective view of a light emitting diode package according to one exemplary embodiment of the present disclosure.

Referring to FIG. 5, the light emitting diode package includes a substrate 300, which includes a first frame 311, a second frame 313, and an insulation layer 315 interposed between the first and second frames 311, 313, and a light emitting diode 400, a sub-mount substrate 200 and a wire 330, which are mounted in a cavity 317 formed on an upper surface of the substrate 300.

The light emitting diode 400 is the light emitting diode according to the exemplary embodiments of the present disclosure described above.

The first and second frames 311, 313 may be metal frames or ceramic frames. When the first and second frames 311, 313 are metal frames, the first and second frames 311, 313 may include a metal including Al, Ag, Cu, or Ni, or alloys thereof, which exhibit good properties in terms of electrical characteristics and heat dissipation.

The insulation layer 315 may include a bonding portion, through which the first and second frames 311, 313 are secured to both sides thereof. The wire 330 connects pads to a power source such that electric power can be supplied to the light emitting diode 400 therethrough.

Figure 6:
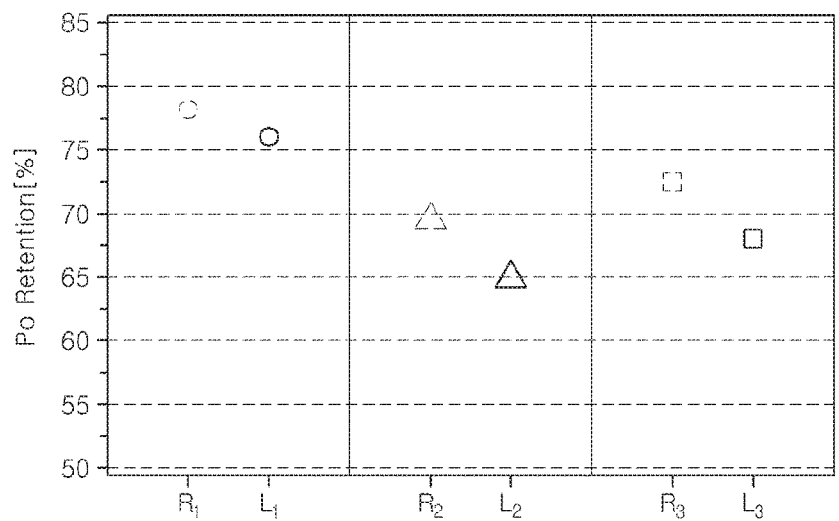
FIG. 6 shows graphs depicting effects of exemplary embodiments of the present disclosure.

FIG. 6 shows graphs depicting effects of exemplary embodiments of the present disclosure.

FIG. 6 shows graphs depicting results after 1000-hour reliability testing. The light emitting diode (Comparative Example) as shown in FIG. 1 and the light emitting diode (Example) as shown in FIGS. 2A and 2B have the same size, and ultrasonic bonding was performed on a Si substrate using a TDK flip bonder. Upon ultrasonic bonding, a bonding table temperature was set to 200° C. and a nozzle temperature was set to 150° C.

Referring to FIG. 6, the Y-axis indicates a power retention rate of each of the light emitting diodes. On the X-axis, each of R1, R2 and R3 is an average value of measurement results in Example and indicated by a dotted-line figure. On the X-axis, each of L1, L2 and L3 is an average value of measurement result in Comparative Example and indicated by a solid-line figure.

Each of R 1 and L1 indicates a measurement result at room temperature and is indicated by a circle. Each of R2 and L2 indicates a measurement result at high temperature (60° C.) and is indicated by a triangle. Each of R3 and L3 indicates a measurement result at high temperature/high humidity (60° C., 90%) conditions and is indicated by a rectangle. In FIG. 6, it can be seen that the light emitting diode of Example has higher power retention rates.

The light emitting diodes according to the exemplary embodiments have good moisture-proof characteristics and improved reliability, and allow strong flip bonding, thereby providing high structural stability.

Figure 7:
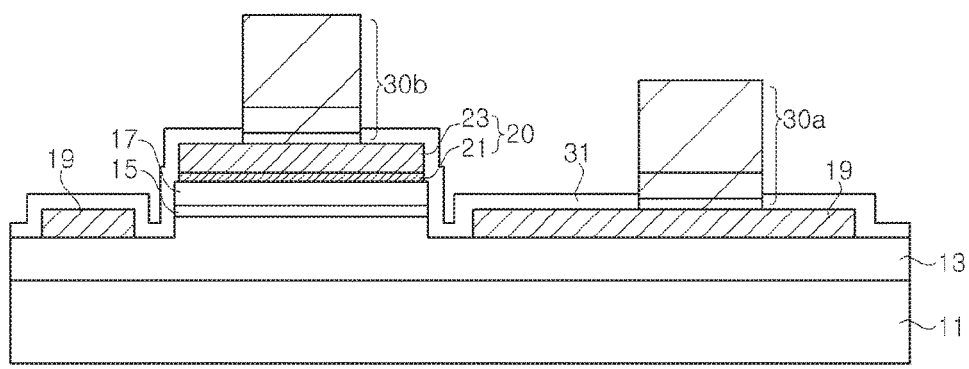
FIG. 7 is a schematic sectional view of a light emitting diode.

FIG. 7 is a schematic sectional view of a flip-chip type light emitting diode. Referring to FIG. 7, the light emitting diode includes a growth substrate 11, a first conductive type semiconductor layer 13, an active layer 15, a second conductive type semiconductor layer 17, a first electrode 19, a second electrode 20, a first pad 30a, a second pad 30b, and an insulation layer 31. A light emitting cell may be composed of the first conductive type semiconductor layer 13, the active layer 15 and the second conductive type semiconductor layer 17. The first conductive type semiconductor layer 13 and the second conductive type semiconductor layer 17 may be electrically connected to the first pad 30a and the second pad 30b, respectively.

The light emitting diode of FIG. 7 has a problem of current crowding due to lateral arrangement of the electrodes 19, 20 upon high current operation thereof. As a result, the light emitting diode suffers from deviation in luminous intensity and deterioration in luminous efficacy. Therefore, there is a need for development of a light emitting diode capable of achieving current spreading through dispersion of electric current in the light emitting diode.

Next, a light emitting diode according to a further exemplary embodiment will be described with reference to FIG. 8A to FIG. 11.

FIGS. 8A and 8B show a plan view and a cross-sectional view of a light emitting diode according to one exemplary embodiment of the present disclosure.

FIG. 8A is a plan view of the light emitting diode and FIG. 8B is a cross-sectional view of the light emitting diode taken along line A-A of FIG. 8A.

Referring to FIGS. 8A and 8B, the light emitting diode according to this exemplary embodiment includes a growth substrate 500 and a light emitting cell 510, which includes a lower semiconductor layer 515, an active layer 513 and a first upper semiconductor layer 511. A first current spreading portion 520 and a second current spreading portion 530, which include a portion of the lower semiconductor layer 515, are disposed on the lower semiconductor layer 515. Further, a second electrode 540 is disposed on the lower semiconductor layer 515 and includes a second contact layer 541 and a second pad layer 543. Further, a second bump 570 is disposed on the second electrode 540.

A first electrode 550 is disposed on the first upper semiconductor layer 511 and includes a first contact layer 551 and a first pad layer 553. A first bump 580 is disposed on the first electrode 550. In addition, an insulation layer 560 is disposed on an overall upper surface of the light emitting diode excluding first and second open regions 550a, 540a in which the first and second bumps 580, 570 will be disposed.

Referring again to FIGS. 8A and 8B, the growth substrate 500 is a substrate having a hexagonal crystal structure and may be a growth substrate which allows growth of a gallium nitride epitaxial layer thereon, for example, a sapphire substrate, a silicon carbide substrate, or a gallium nitride substrate. The growth substrate 500 may include one surface, the other surface opposite the one surface, and a side surface connecting the one surface to the other surface. The one surface of the growth substrate is a surface on which semiconductor layers are grown, and the other surface thereof is a surface through which light generated from the active layer 513 is discharged. The side surface of the growth substrate 500 may be perpendicular to the one surface and the other surface, or may be an inclined surface. Before formation of the lower semiconductor layer 515 on the one surface of the growth substrate 100, a buffer layer (not shown) including AlN or GaN may be formed thereon in order to reduce lattice mismatch with the sapphire substrate. The growth substrate 500 may have a substantially quadrangular shape, without being limited thereto.

In this exemplary embodiment, the growth substrate 500 may have a thickness of greater than 100 μm, specifically 150 μm to 400 μm. A higher thickness of the growth substrate 500 provides better light extraction efficiency. On the other hand, the side surface of the growth substrate 500 may include a breaking plane.

The lower semiconductor layer 515 is disposed on one surface of the growth substrate 500. The lower semiconductor layer 515 covers the entirety of the one surface of the growth substrate 500, without being limited thereto. Alternatively, the lower semiconductor layer 515 may be disposed restrictively on an upper region of the growth substrate 500 such that the one surface of the growth substrate is exposed along an edge thereof.

The first upper semiconductor layer 511 is disposed on one region of the lower semiconductor layer 515 and the active layer 513 is interposed between the lower semiconductor layer 515 and the upper semiconductor layer 511. Furthermore, second and third upper semiconductor layers 521, 531 may be disposed on different regions of the lower semiconductor layer 515, and the active layer 513 may be interposed between each of the second and third upper semiconductor layers 521, 531 and the lower semiconductor layer 515.

The first upper semiconductor layer 511 may have an H shape or a dumbbell shape with a narrow waist, thereby providing good light output under high current density conditions.

The lower semiconductor layer 515 and the upper semiconductor layers 511, 521, 531 may include Group 111-V based compound semiconductors, and, for example, may include a nitride-based semiconductor such as (Al, Ga, In)N. The lower semiconductor layer 515 may include an n-type semiconductor layer doped with n-type dopants (for example, Si) and the upper semiconductor layers 511, 521, 531 may include a p-type semiconductor layer doped with p-type dopants (for example, Mg), or vice versa. In addition, the lower semiconductor layer 515 and/or the upper semiconductor layers 511, 521, 531 may be composed of a single layer or multiple layers. For example, the lower semiconductor layer 515 and/or the upper semiconductor layers 511, 521, 531 may include a clad layer and a contact layer, and may include a super-lattice layer.

The active layer 513 may include a multi-quantum well (MQW) structure and elements and a composition of the multi-quantum well (MQW) structure may be adjusted to emit light having a desired peak wavelength. For example, well layers of the active layer 113 may be ternary semiconductor layers such as $In_xGa(1-x)N(O:S; x:S; 1)$, or quaternary semiconductor layers such as $Al_xIn_yGa(1-x-y)N(O:S; x:S; 1, O:S; y:S; 1, O:S; x+y:S; 1)$, in which x or y may be adjusted to emit light having a desired peak wavelength, without being limited thereto.

The above semiconductor layers 511, 513, 515, 521, 531 may be formed through various deposition and growth processes including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and the like.

Herein, descriptions of details of the semiconductor layers 511, 513, 515, 521, 531 including 111-V based compound semiconductors well known to those skilled in the art will be omitted.

On the other hand, the first current spreading portion 520 and the second current spreading portion 530 may be disposed on one region of the lower semiconductor layer 515. The first current spreading portion 520 may be disposed in a region in which the second bump 570 will be formed. The first current spreading portion 520 may include the semiconductor layers 515, 523, 521 including a portion of the lower semiconductor layer 515. That is, the first current spreading portion 520 may include the second upper semiconductor layer 521 disposed on a different region of the lower semiconductor layer 515 and the active layer 523 interposed between the lower semiconductor layer 515 and the second upper semiconductor layer 521. The first current spreading portion 520 can serve to spread electric current when electric current is injected through the second bump 570. That is, the first current spreading portion 520 blocks electric current from linearly flowing towards the lower semiconductor layer 515 and spreads the electric current therethrough, thereby improving current spreading. The first current spreading portion 520 may be flush with the light emitting cell 510. That is, since the first current spreading portion 520 has the same height as the light emitting cell 510, it is possible to overcome a step between the second bump 570 disposed on the first current spreading portion 520 and the first bump 580 disposed on the light emitting cell 510.

The second current spreading portion 530 may be interposed between the first current spreading portion 520 and the light emitting cell 510. The second current spreading portion 530 may include the semiconductor layers 531, 533, 515 including a portion of the lower semiconductor layer 515. That is, the second current spreading portion 530 may include the third upper semiconductor layer 531 disposed on a different region of the lower semiconductor layer 515 and the active layer 533 interposed between the lower semiconductor layer 515 and the third upper semiconductor layer 531.

The second current spreading portion 530 can serve to spread electric current when electric current is injected through the second bump 570, thereby improving current spreading performance of the light emitting diode. The second current spreading portion 530 may be flush with the light emitting cell 510. In this exemplary embodiment, the shape and location of the second current spreading portion 530 are not limited to those shown in the drawings. Accordingly, the second current spreading portion 530 may be disposed in various ways, as needed. Further, the second current spreading portion 530 may be disposed to be closer to or farther away from the light emitting cell 510 than the first current spreading portion. A contact area and region between the second electrode 540 and the lower semiconductor layer 515 can be adjusted through the second current spreading portion 530.

The semiconductor layers of the first current spreading portion 520 and the second current spreading portion 530 may be formed by the same process as the semiconductor layers of the light emitting cell 510. In addition, although the first current spreading portion 520 and the second current spreading portion 530 are illustrated as including an inclined side surface in this exemplary embodiment, it should be understood that the shapes of the first and second current spreading portions 520, 530 are not limited thereto. In this exemplary embodiment, the first and second current spreading portions 520, 530 may include flat upper surfaces.

On the other hand, the second electrode 540 may be disposed on the lower semiconductor layer 515 and the first and second current spreading portions 520, 530 excluding a region in which the light emitting cell 510 is disposed. The second electrode 540 may include the second contact layer 541 and the second pad layer 543. The second electrode 540 may surround the first upper semiconductor layer 511 of the light emitting cell 510. Although the second electrode 540 is illustrated as surrounding the entire periphery of the first upper semiconductor layer 511 in FIGS. 8A and 8B, it should be understood that other implementations are also possible. The second electrode 540 may extend from the second bump 570 to both sides of the first upper semiconductor layer 511 so as to surround about 50% or more of the first upper semiconductor layer 511. The second contact layer 541 may include at least one of Cr, Ti, Al and Au, or may have a multilayer structure of Cr/Ti/Al/Ti/Au layers. In the multilayer structure of the second contact layer 541, the Cr layer may have a thickness of about 100 A, the Ti layer may have a thickness of about 200 A, the Al layer may have a thickness of about 600 A, the Ti layer may have a thickness of about 200 A, and the Au layer may have a thickness of about 1,000 A, without being limited thereto. The second pad layer 543 may include Ti or Au, or may have a multilayer structure of Ti/Au layers.

The second electrode 540 may further include a reflective layer. The reflective layer may include at least one of Ni, Pt, Pd, Rh, W, Ti, Al, Ag and Au, and may have a multilayer structure of these element layers. However, it should be understood that other implementations are also possible.

The second electrode 540 can reflect light emitted from the active layer 513 of the light emitting cell 510 through the reflective layer. Specifically, the light emitting diode according to this exemplary embodiment includes current spreading portions 520, 530, and a critical angle of incidence light traveling from the active layer 513 to the second electrode 540 can be varied by the current spreading portions 520, 530. Accordingly, the light emitting diode can suffer from severe scattering of light entering the second electrode 540. Since the second electrode 540 may include the reflective layer, the reflective layer can reflect light entering the second electrode to a light extraction plane, thereby improving light extraction efficiency of the light emitting diode.

Contact resistance between the second electrode 540 and the second upper semiconductor layer 521 included in the first current spreading portion 520 may be higher than contact resistance between the second electrode 540 and the lower semiconductor layer 515. Contact resistance between the second electrode 540 and the third upper semiconductor layer 531 included in the second current spreading portion 530 may be higher than contact resistance between the second electrode 540 and the lower semiconductor layer 515. In this exemplary embodiment, the lower semiconductor layer 515 may be a semiconductor layer doped with n-type dopants and the upper semiconductor layers 511, 521, 531 may be semiconductor layers doped with p-type dopants. Thus, contact resistance between the second electrode 540 including a metal and the lower semiconductor layer 515 may be lower than contact resistance between the second electrode 540 and the upper semiconductor layers 511, 521, 531. Accordingly, the upper semiconductor layers 511, 521, 531 can act as resistors in the light emitting diode.

When applied to the light emitting diode of FIG. 7 through a metal electrode, electric current flows through the metal electrode and the semiconductor layer since the semiconductor layer contacting the metal electrode has conductivity. In this exemplary embodiment, since the upper semiconductor layers 521, 531 of the first and second current spreading portions 520, 530 act as resistors as described above, it is possible to adjust the area of the contact region between the lower semiconductor layer 515 and the second electrode 540. Thus, the light emitting diode according to this exemplary embodiment can guide electric current to flow mainly to the second electrode 540 surrounding at least part of the light emitting cell 510, thereby improving current spreading.

In this exemplary embodiment, since the second electrode 540 does not contact the lower semiconductor layer 515 in a region in which the second current spreading portion 530 and the first current spreading portion 520 are disposed, a contact area between the second electrode 540 and the lower semiconductor layer 515 can be reduced. Since reduction in the contact area can cause increase in drive voltage of the light emitting diode, the total area of the upper surfaces of the second current spreading portion 530 and the first current spreading portion 520 may be 10% to 40% of the total area of the second electrode 540 in order to maintain suitable drive voltage. If the total area of the upper surfaces of the first and second current spreading portions 520, 530 is less than 10% of the total area of the second electrode 540, it can be difficult to realize effects of embodiments of the present disclosure such as improvement in current spreading and the like, and if the total area of the upper surfaces of the first and second current spreading portions 520, 530 exceeds 40%, the drive voltage of the light emitting diode can be increased. Accordingly, in the light emitting diode according to this exemplary embodiment, the first and second current spreading portions 520, 530 are disposed in the above range, thereby improving current spreading performance of the light emitting diode while satisfying a desired drive voltage.

Further, although the second electrode 540 is illustrated as covering the second current spreading portion 530 in this exemplary embodiment, it should be understood that other implementations are also possible. Alternatively, the second electrode 540 may cover a portion of the second current spreading portion.

On the other hand, the first electrode 550 may be disposed on the light emitting cell 510. The first electrode 550 may include the first contact layer 551 and the first pad layer 553. The first electrode 550 may be disposed on the first upper semiconductor layer 511 to be electrically connected to the first upper semiconductor layer 511. The first contact layer 551 may include at least one of Ni, Au and Al, or may have a multilayer structure of Ni/Au layers. In the multilayer structure of the first contact layer 551, the Ni layer may have a thickness of about 150 A and the Au layer may have a thickness of about 300 A. The second pad layer 553 may include at least one of Ti, Au and Cr, or may have a multilayer structure of Ti/Au/Cr/Au layers. In the multilayer structure of the second pad layer 553, the Ti layer may have a thickness of about 300 A, the Au layer may have a thickness of about 2 µm, the Cr layer may have a thickness of about 200 A, and the Au layer may have a thickness of about 2.5 µm. The first electrode 550 can form ohmic contact with the first upper semiconductor layer 511 while exhibiting high reflectivity.

The first bump 580 is disposed on the first electrode 550. The second bump 570 is disposed on the second electrode 540. The first bump 580 may include a first region A1 and a second region A2. The first bump 580 may include a first concave portion and a first convex portion formed on an upper surface thereof. The first region A1 may include the first concave portion and thus an upper surface of the first region A1 may correspond to a bottom surface of the first concave portion. The second region A2 may include the first convex portion and thus an upper surface of the second region A2 may correspond to an upper surface of the first convex portion.

The second bump 570 may include a third region A3 and a fourth region A4. The second bump 570 may include a second concave portion and a second convex portion formed on an upper surface thereof. The third region A3 may include the second concave portion and thus an upper surface of the third region A3 may correspond to a bottom surface of the second concave portion. The fourth region A4 may include the second convex portion and thus an upper surface of the fourth region A4 may correspond to an upper surface of the second convex portion.

The second bump 570 and the first bump 580 may be formed of the same metallic material. In addition, the first and second bumps 580, 570 may have a multilayer structure, and may include, for example, an adhesive layer, an anti-diffusion layer and a bonding layer. For example, the adhesive layer may include Ti, Cr or Ni, the anti-diffusion layer may include Cr, Ni, Ti, W, TiW, Mo, Pt, or a combination thereof, and the bonding layer may include Au or AuSn. The first and second bumps 580, 570 may have a multilayer structure of Ti/Au/Cr/Au layers, in which the Ti layer may have a thickness of about 300 A, the Au layer may have a thickness of about 2 μm, the Cr layer may have a thickness of about 200 A, and the Au layer may have a thickness of about 2.5 μm.

On the other hand, the insulation layer 560 covers and protects the lower semiconductor layer 515, the first and second current spreading portions 520, 530, and the first and second electrodes 550, 540, excluding regions in which the first bump 580 and the second bump 570 are disposed. The insulation layer 560 may be composed of a single layer of silicon oxide or silicon nitride. Furthermore, the insulation layer 560 may be composed of a distributed Bragg reflector (DBR) in which oxide layers having different indices of refraction are stacked one above another. With this structure, the insulation layer 560 can reflect light emitted through an inclined surface between the upper semiconductor layer 511 and the lower semiconductor layer 515 and through an exposed portion of the lower semiconductor layer 515, thereby further improving light extraction efficiency of the light emitting diode. In this exemplary embodiment, the insulation layer 560 may be composed of multiple layers of silicon oxide and silicon nitride, or a single layer of silicon oxide. In the structure wherein the insulation layer 560 is composed of multiple layers, the silicon oxide layer may have a thickness of about 2,400 A and the silicon nitride layer may have a thickness of about 5,000 A, and in the structure wherein the insulation layer 560 is composed of the single layer of silicon oxide, the silicon oxide layer may have a thickness of about 6,000 A. However, it should be understood that other implementations are also possible.

Since the silicon nitride layer exhibits better moisture-proof characteristics than the silicon oxide layer, the multilayer structure of the insulation layer 560 can further improve moisture-proof characteristics of the light emitting diode.

In this exemplary embodiment, the first and second bumps 580, 570 may be formed to cover a portion of the insulation layer 560, as shown in the drawings. Thus, at least part of the second region A2 of the first bump 580 may be disposed on the insulation layer 560. In addition, at least part of the fourth region A4 of the second bump 570 may be disposed on the insulation layer 560. That is, part of the insulation layer 560 may be interposed between the first bump 580 and the first electrode 550 and/or between the second bump 570 and the second electrode 540.

Referring again to FIGS. 8A to 8B, the insulation layer 560 may include a first open region 550a exposing the first electrode 550 and a second open region 540a exposing the second electrode 540. A side surface of the insulation layer 560 surrounding each of the first and second open regions 550a, 540a may be exposed and may adjoin the first bump 580 and/or the second bump 570.

Referring again to FIG. 8A, it can be seen that the area of the first open region 550a is smaller than the sum of the areas of the bottom surface of the first concave portion of the first bump 580 and the upper surface of the first convex portion thereof. In addition, it can be seen that the area of the second open region 540b is smaller than the sum of the areas of the bottom surface of the second concave portion of the second bump 530b and the upper surface of the second convex portion thereof. That is, in this exemplary embodiment, the first and second bumps 580, 570 can completely cover the first open region 550a and the second open region 540a, respectively.

According to this exemplary embodiment, the first and second bumps 580, 570 may surround the first and second electrodes 550, 540 together with the insulation layer 560. With this structure, the light emitting diode can prevent external moisture from permeating the light emitting diode, thereby improving reliability of the light emitting diode. Further, according to this exemplary embodiment, the concave portions and the convex portions of the first and second bumps 580, 570 allow the light emitting diode to be mounted on a printed circuit board or a sub-mount substrate with stronger coupling strength.

Figure 9A:
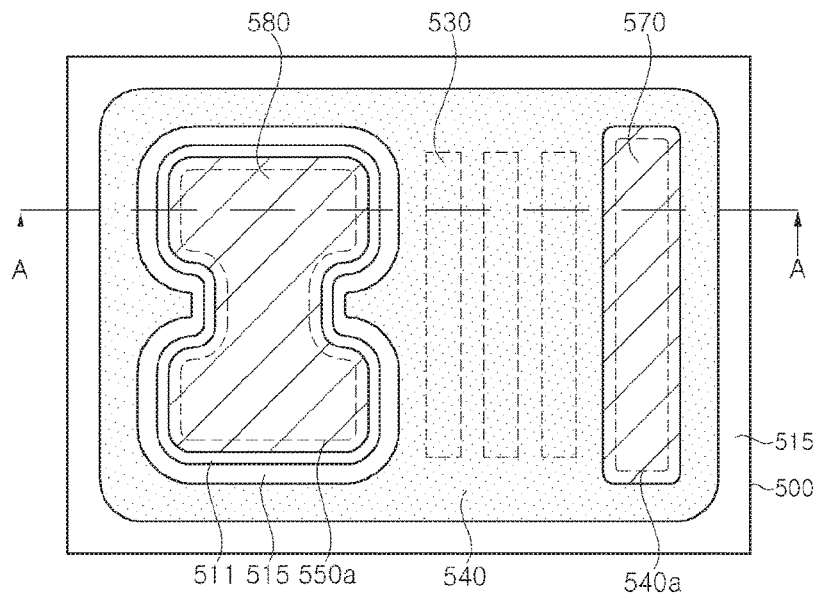
FIGS. 9A and 9B show a plan view and a cross-sectional view of a light emitting diode according to another exemplary embodiment of the present disclosure.
Figure 9B:
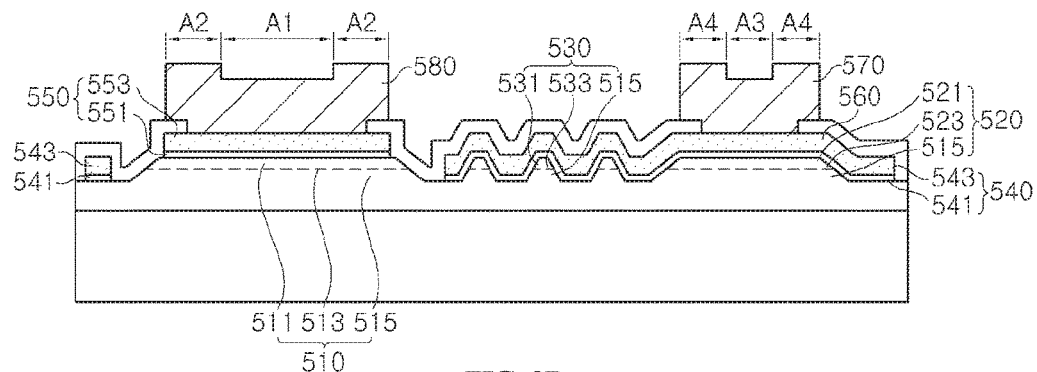

FIGS. 9A and 9B show a plan view and a cross-sectional view of a light emitting diode according to another exemplary embodiment of the present disclosure. The light emitting diode according to this embodiment is the same as the light emitting diode according to the above embodiment excluding the shape and location of the second current spreading portion 530. Thus, repeated descriptions of the same components will be omitted.

Referring to FIGS. 9A and 9B, the second current spreading portion 530 includes one or more spreading structures, which have a rectangular shape having a longer side in the vertical direction. Thus, the light emitting diode allows electric current to spread in a region in which the second current spreading portion 530 is formed, thereby improving current spreading performance.

As shown in FIGS. 9A and 9B, the spreading structures of the second current spreading portion 530 may have the same shape and be arranged at regular intervals, or may have different shapes and be arranged at irregular intervals. The spreading structures of the second current spreading portion 530 may be disposed closer to the first current spreading portion 520 than the light emitting cell 510. That is, a distance between the light emitting cell 510 and the spreading structure of the second current spreading portion 530 closest to the light emitting cell 510 may be greater than a distance between the first current spreading portion 520 and the spreading structure of the second current spreading portion 530 closest to the first current spreading portion 520.

Figure 10:
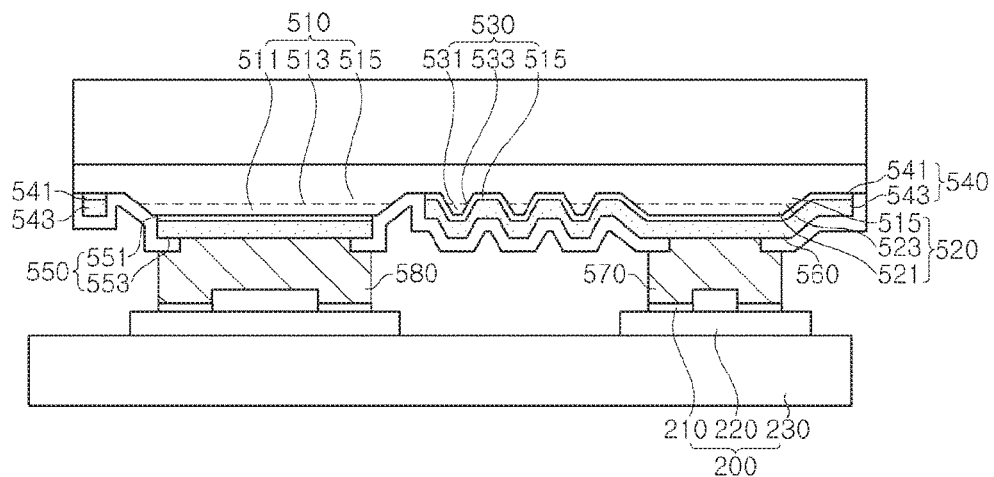
FIG. 10 is a side sectional view of a light emitting device according to one exemplary embodiment of the present disclosure.

FIG. 10 is a side-sectional view of a light emitting device according to one exemplary embodiment of the present disclosure.

Referring to FIG. 10, the light emitting diode is the light emitting diode according to the exemplary embodiments described above and is mounted on a sub-mount substrate 200.

The sub-mount substrate 200 includes a substrate 230 and an electrode pattern 220 disposed on the substrate 230. The substrate 230 may be any one selected from among BeO, SiC, Si, Ge, SiGe, AlN and ceramic substrates, which exhibit good thermal conductivity. However, it should be understood that other implementations are also possible and that the sub-mount substrate may include an insulation material having high thermal conductivity or a metallic material having high thermal conductivity and high electrical conductivity.

The electrode pattern 220 is formed corresponding to the shapes of the second bump 570 and the first bump 580 such that the second bump 570 and the first bump 580 are bonded to the electrode pattern 220. Here, bonding may be performed using heat, ultrasonic waves, or a combination thereof. Alternatively, the second bump 570 and the first bump 580 are bonded to the electrode pattern 220 via solder pastes.

However, it should be understood that other implementations are also possible and that the first and second bumps 580, 570 may be bonded to the electrode pattern 220 in a bonding region 210 through various bonding methods including the methods as described above.

Figure 11:
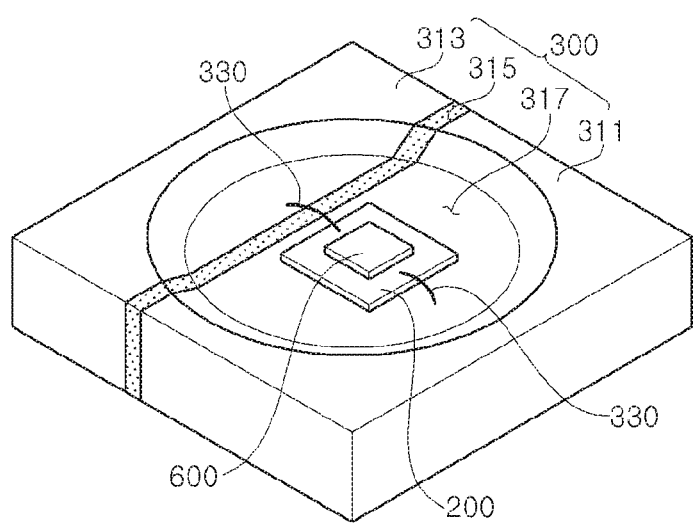
FIG. 11 is a perspective view of a light emitting diode package according to one exemplary embodiment of the present disclosure.

FIG. 11 is a perspective view of a light emitting diode package according to one exemplary embodiment of the present disclosure.

Referring to FIG. 11, the light emitting diode package includes a substrate 300, which includes a first frame 311, a second frame 313, and an insulation layer 315 interposed between the first and second frames 311, 313, and a light emitting diode 600, a sub-mount substrate 200 and a wire 330, which are mounted in a cavity 317 formed on an upper surface of the substrate 300. The light emitting diode 600 is the light emitting diode according to the exemplary embodiments of the present disclosure described above.

The first and second frames 311, 313 may be metal frames or ceramic frames. When the first and second frames 311, 313 are metal frames, the first and second frames 311, 313 may include a metal including Al, Ag, Cu, or Ni, or alloys thereof, which exhibit good properties in terms of electrical characteristics and heat dissipation.

The insulation layer 315 may include a bonding portion, through which the first and second frames 311, 313 are secured to both sides thereof. The wire 330 connects pads to a power source such that electric power can be supplied to the light emitting diode 600 therethrough.

Although some exemplary embodiments have been described herein, it should be understood that these embodiments are given by way of illustration only and various modifications, variations and alterations can be made by those skilled in the art without departing from the spirit and scope of the present disclosure. Therefore, it should be understood that these embodiments and the accompanying drawings are given by way of illustration only and do not limit the scope of the present disclosure. The scope of the present disclosure should be interpreted according to the appended claims and equivalents thereof.

The invention claimed is:

1. A light emitting diode comprising:
 a substrate;
 a lower semiconductor layer disposed on the substrate;
 a light emitting cell comprising a first upper semiconductor layer disposed in one region of the lower semiconductor layer and an active layer interposed between the lower semiconductor layer and the first upper semiconductor layer;
 a second current spreading portion comprising a third upper semiconductor layer disposed in another region of the lower semiconductor layer and an active layer interposed between the lower semiconductor layer and the third upper semiconductor layer;
 a first electrode disposed on the light emitting cell and electrically connected to the first upper semiconductor layer; and
 a second electrode separated from the light emitting cell and electrically connected to the lower semiconductor layer,
 wherein the second electrode extends to cover at least part of the second current spreading portion and surrounding at least part of the light emitting cell, and
 wherein contact resistance between the second electrode and the third upper semiconductor layer is higher than contact resistance between the second electrode and the lower semiconductor layer.

2. The light emitting diode according to claim 1, further comprising:
 a first current spreading portion disposed in a third region of the lower semiconductor layer opposite the one region of the lower semiconductor layer with reference to the other region of the lower semiconductor layer,
 wherein the first current spreading portion comprises a second upper semiconductor layer disposed in the third region of the lower semiconductor layer and an active layer interposed between the lower semiconductor layer and the second upper semiconductor layer.

3. The light emitting diode according to claim 2, wherein contact resistance between the second electrode and the second upper semiconductor layer is higher than contact resistance between the second electrode and the lower semiconductor layer.

4. The light emitting diode according to claim 2, wherein the second electrode is disposed on the first current spreading portion.

5. The light emitting diode according to claim 2, wherein the second current spreading portion is disposed closer to the first current spreading portion than the light emitting cell.

6. The light emitting diode according to claim 2, wherein the first current spreading portion has the same height as the light emitting cell.

7. The light emitting diode according to claim 2, wherein a sum of areas of upper surfaces of the first current spreading portion and the second current spreading portion is 10% to 40% of an area of the second electrode.

8. The light emitting diode according to claim 1, wherein the second current spreading portion comprises a plurality of spreading structures separated at regular intervals from one another.

9. The light emitting diode according to claim 1, further comprising:
 an insulation layer disposed on the first electrode and the second electrode, and comprising a first open region exposing the first electrode and a second open region exposing the second electrode.

10. The light emitting diode according to claim 9, wherein the insulation layer comprises at least one of a silicon nitride layer and a silicon oxide layer.

11. The light emitting diode according to claim 9, wherein the insulation layer comprises a distributed Bragg reflector.

12. The light emitting diode according to claim 9, further comprising:
 a first bump electrically connected to the first electrode through the first open region; and
 a second bump electrically connected to the second electrode through the second open region.

13. The light emitting diode according to claim 12, wherein the first bump comprises a first concave portion and a first convex portion that are formed on an upper surface of the first bump,
 wherein the first bump comprises a first region having a top surface including a bottom surface of the first concave portion and a second region having a top surface including an upper surface of the first convex portion, and
 wherein at last part of the first region is disposed on the first open region and at least part of the second region is disposed on the insulation layer.

14. The light emitting diode according to claim 12, wherein an area of the bottom surface of the first concave portion is proportional to an area of the first electrode exposed through the first open region.

15. The light emitting diode according to claim 12, wherein a depth of the first concave portion is proportional to a thickness of the insulation layer disposed on the first electrode.

16. The light emitting diode according to claim 12, wherein the sum of areas of the upper surface of the first convex portion and the bottom surface of the first concave portion is larger than the area of the first electrode exposed through the first open region.

17. The light emitting diode according to claim 12, wherein the first convex portion surrounds the first concave portion.

18. The light emitting diode according to claim 12, wherein the insulation layer is partially interposed between the first electrode and the first bump and between the second electrode and the second bump.

19. The light emitting diode according to claim 12, wherein a side surface of the insulation layer surrounding the first open region adjoins at least part of a side surface of the first bump.

20. The light emitting diode according to claim 1, wherein the second electrode comprises a reflective layer reflecting light emitted though the active layer of the light emitting cell.

* * * * *